(12) United States Patent
Hung et al.

(10) Patent No.: US 11,604,496 B2
(45) Date of Patent: Mar. 14, 2023

(54) MODULAR REPLACEABLE MOBILE COMMUNICATION DEVICE

(71) Applicant: LANNER ELECTRONICS INC., New Taipei (TW)

(72) Inventors: Shih-Tai Hung, New Taipei (TW); Hsiang-Chun Tseng, Hsinchu (TW)

(73) Assignee: LANNER ELECTRONICS INC., New Taipei (TW)

( * ) Notice: Subject to any disclaimer, the term of this patent is extended or adjusted under 35 U.S.C. 154(b) by 0 days.

(21) Appl. No.: 17/459,492

(22) Filed: Aug. 27, 2021

(65) Prior Publication Data
US 2022/0283613 A1 Sep. 8, 2022

(30) Foreign Application Priority Data
Mar. 3, 2021 (CN) .......................... 202120454004.2

(51) Int. Cl.
*G06F 1/18* (2006.01)
*H05K 7/14* (2006.01)

(52) U.S. Cl.
CPC .............. *G06F 1/186* (2013.01); *G06F 1/181* (2013.01); *H05K 7/1408* (2013.01)

(58) Field of Classification Search
CPC ........ G06F 1/181; G06F 1/186; G06F 1/1658; G06F 1/1698; H01Q 1/2275; H01Q 1/241; H05K 7/1408
See application file for complete search history.

(56) References Cited

U.S. PATENT DOCUMENTS 8,260,379 B2 * 9/2012 Youn ..................... G06F 1/1658
455/575.1
8,477,074 B2 * 7/2013 Fukuchi ................. H01Q 1/244
343/702

* cited by examiner

*Primary Examiner* — James Wu
(74) *Attorney, Agent, or Firm* — Locke Lord LLP; Tim Tingkang Xia, Esq.

(57) ABSTRACT

A mobile communication device is disclosed, and is modularized to include an electronic device for performing mobile communication and a frame assembly. The frame assembly comprises a circuit board having an electrical connection interface and a frame having a recess for receiving the electronic device. In addition, a first electrical connector is disposed on a side wall of the recess, and the electronic device has a second electrical connector connected to the first electrical connector, such that the electronic device coupled to the circuit board via the forgoing two electrical connectors. By inserting the mobile communication device into an accommodation space in a casing of a host electronic device, the electrical connection interface is inserted into an electrical slot that is arranged in a printed circuit board in the casing, thereby achieving a function expansion of mobile communication for the host electronic device.

6 Claims, 6 Drawing Sheets

MODULAR REPLACEABLE MOBILE COMMUNICATION DEVICE

BACKGROUND OF THE INVENTION

1. Field of the Invention

The present invention relates to the field of communication technologies, and more particularly to a modular replaceable mobile communication device.

2. Description of the Prior Art

With the rapid development of science and technology, server computers and industrial computers are widely applied in fields of medical, finance, communication, environmental protection, and transportation. Therefore, since the server computer and the industrial computer are becoming more and more important, how to properly design the constituting units and elements of the server computer thereby making the server computer can be manufactured through modular assembly therefore becomes the most important issue.

On the other hand, besides connecting to internet network through wired connection (e.g. Ethernet connection), the server computer is further equipped with a mobile communication device for carrying out a 4G/5G mobile communication. Therefore, casing of the server computer is commonly provided with an accommodating space for setting the mobile communication device. However, the server computers with different product models may have difference in their height and/or width; accordingly, it is required to produce various mobile communication devices with different height and/or width.

In other words, the server computers with different height and/or width certainly equipped with corresponding mobile communication devices with different height and/or width. As a result, for the server computer manufactures, cost of designing, manufacturing and/or assembling for a server computer including a mobile communication device is hence high. For above reasons, there is a need to improve the structure of the conventional mobile communication device, thereby making the mobile communication device can be integrated into a server computer through modular assembly, without being limited by volume size of the server computer.

Accordingly, inventors of the present application have made great efforts to make inventive research and eventually provided a mobile communication device.

SUMMARY OF THE INVENTION

The primary objective of the present invention is to disclose a modular replaceable mobile communication device. The modular replaceable mobile communication device is modularized to include an electronic device for performing 3G/4G/5G/6G mobile communication and a frame assembly for fixing the electronic device therein. The frame assembly comprises a circuit board having an electrical connection interface and a frame having a recess for receiving the electronic device. In addition, a first electrical connector is disposed on a side wall of the recess, and the electronic device has a second electrical connector that is electrically connected to the first electrical connector, such that the electronic device coupled to the circuit board via the forgoing two electrical connectors. By inserting the modular replaceable mobile communication device into an accommodation space in a casing of a host electronic device, the electrical connection interface is inserted into an electrical slot that is arranged in a printed circuit board in the casing of the host electronic device, such that a function expansion of mobile communication for the host electronic device is therefore achieve.

In order to achieve the primary objective, the present invention discloses an embodiment of the modular replaceable mobile communication device, which comprises:

a frame assembly, comprising a circuit board having an electrical connection interface and a frame disposed on the circuit board, wherein the frame has a receiving recess, and a first electrical connector being disposed on a side wall of the receiving recess so as to electrically connect to the circuit board; and an electronic device, being disposed in the receiving recess, and comprising a second casing, a mobile communication circuit disposed in the second casing, at least one SIM card electrically connected to the mobile communication circuit, at least one antenna connected to the second casing and electrically connected to the mobile communication circuit, and a second electrical connector electrically connected between the mobile communication circuit and the first electrical connector;

wherein by inserting the modular replaceable mobile communication device into the accommodation space in the first casing of the host electronic device, the electrical connection interface being inserted into an electrical slot that is arranged in a printed circuit board in the first casing, such that a function expansion of mobile communication for the host electronic device is therefore achieve.

Moreover, the present invention further discloses another one embodiment of the modular replaceable mobile communication device, which comprises:

a frame assembly, comprising a supporting board and a frame disposed on the supporting board, wherein the frame has a receiving recess, and a first electrical connector is disposed on a side wall of the receiving recess;

an electronic device, being disposed in the receiving recess, and comprising a second casing, a mobile communication circuit disposed in the second casing, at least one SIM card electrically connected to the mobile communication circuit, at least one antenna connected to the second casing and electrically connected to the mobile communication circuit, and a second electrical connector electrically connected between the mobile communication circuit and the first electrical connector; and an electrical cable, wherein two ends of the electrical cable are connected with said first electrical connector of the frame and a third electrical connector, respectively;

wherein by inserting the modular replaceable mobile communication device into the accommodation space in the first casing of the host electronic device, the third electrical connector electrically connected to an electrical connection interface that is arranged in a printed circuit board in the first casing, such that a function expansion of mobile communication for the host electronic device is therefore achieve.

In one embodiment, the modular replaceable mobile communication device is inserted into the first casing through a first opening of the first casing, and the frame assembly further comprises a front panel that is connected to the frame and covers the first opening.

In one embodiment, the SIM card is selected from a group consisting of 3G SIM card, 4G SIM card, 5G SIM card, and 6G SIM card.

In a practicable embodiment, the front panel is provided with a second opening thereon, and a rear-end side of the second casing is exposed out of the front panel through the second opening.

In one embodiment, the antenna is connected to the rear-end side of the second casing so as to further electrically connected to the mobile communication circuit that is disposed in the second casing, and the rear-end side is provided with a U-shaped rod thereon.

In one embodiment, a bottom side of the second casing is provided with a third opening thereon, such that at least one socket electrically connected to the mobile communication circuit is exposed out of the second casing, and the SIM card is disposed in the socket.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a modular replaceable mobile communication device disclosed by the present invention, embodiments of the present invention will be described in detail with reference to the attached drawings hereinafter.

First Embodiment

Figure 1:
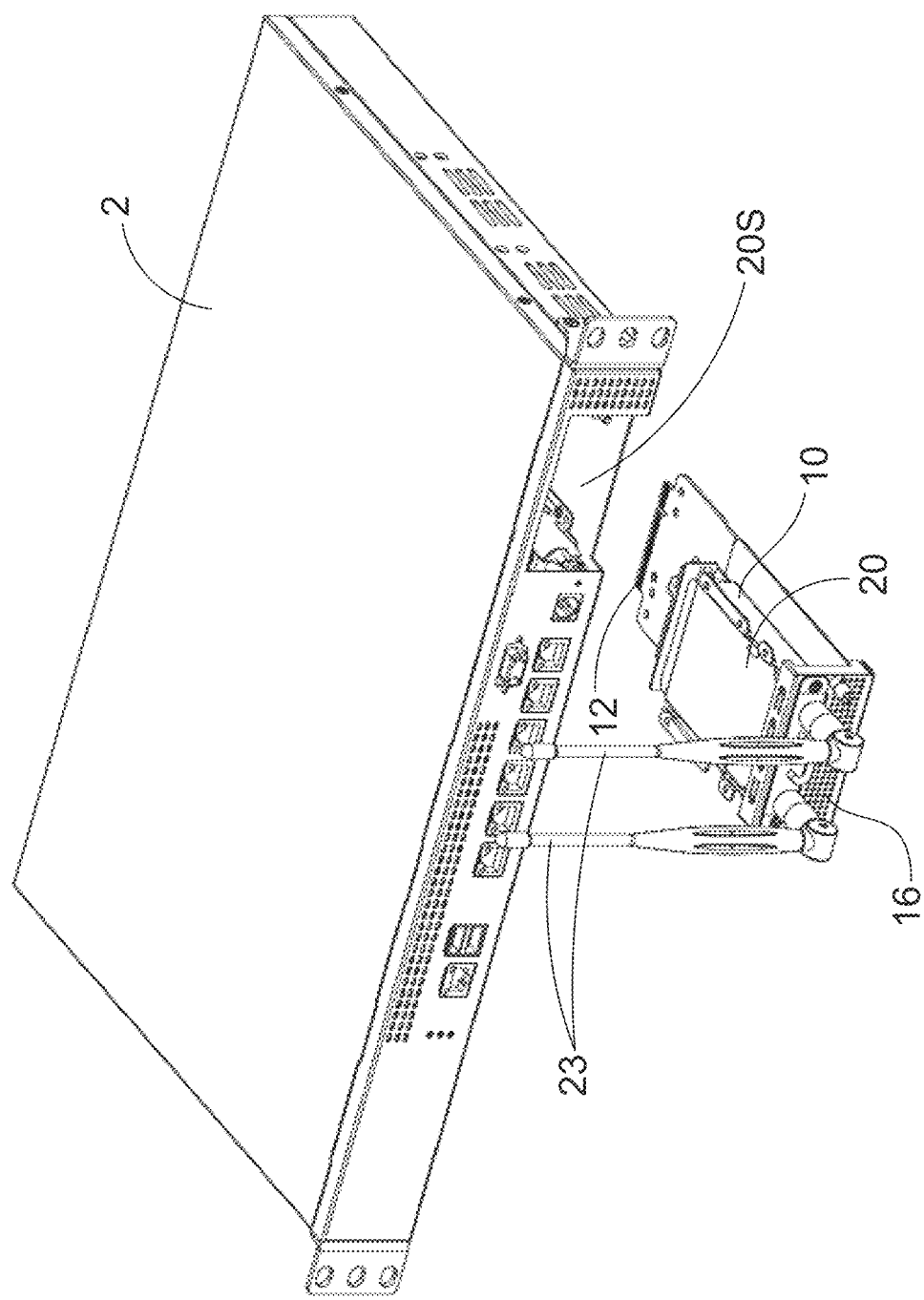
FIG. 1 shows a stereo diagram of a modular replaceable mobile communication device according to the present invention.
Figure 2:
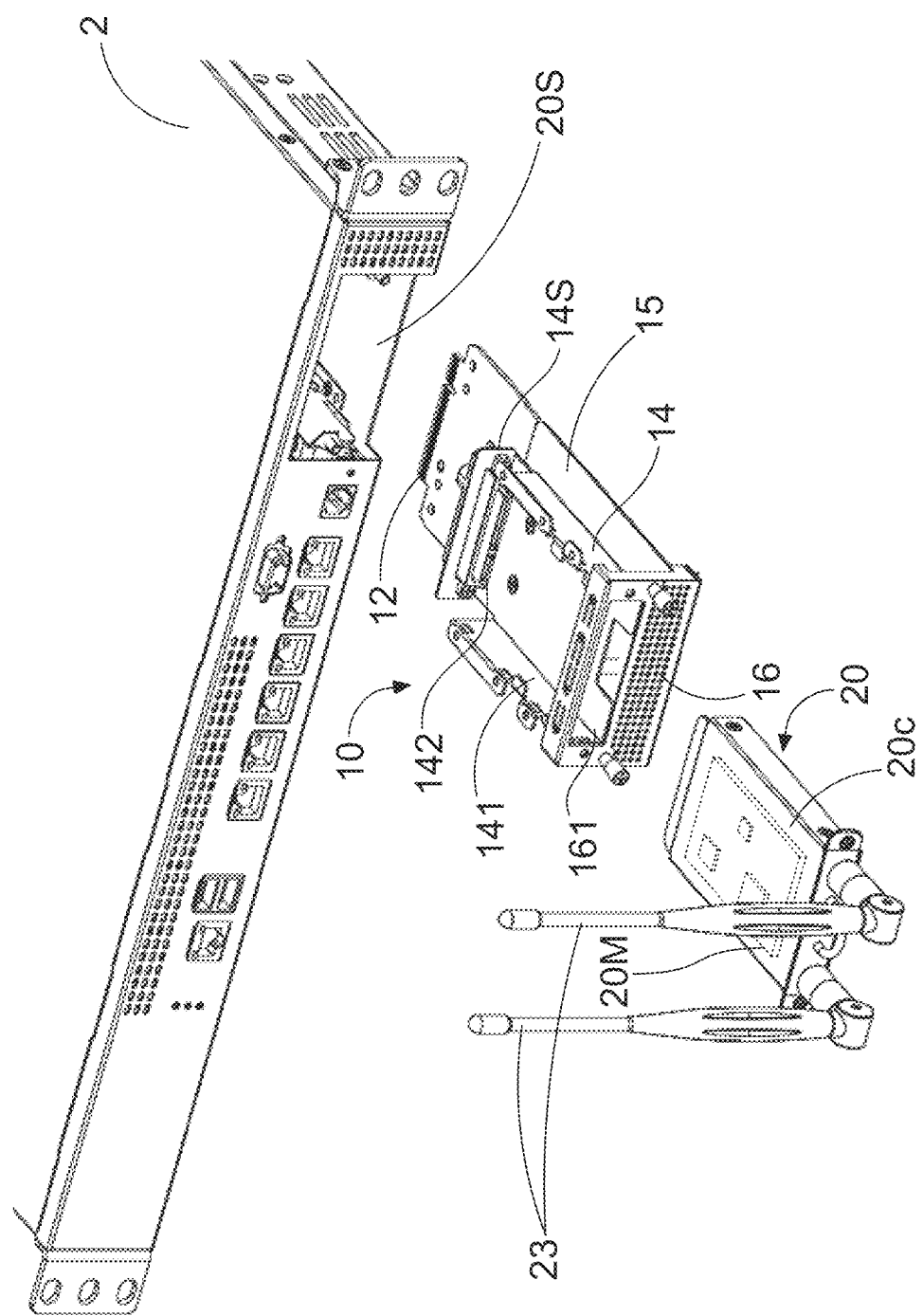
FIG. 2 shows an exploded view of the modular replaceable mobile communication device according to the present invention.

With reference to FIG. 1, there is shown a stereo diagram of a modular replaceable mobile communication device according to the present invention. Moreover, FIG. 2 shows an exploded view of the modular replaceable mobile communication device. As FIG. 1 and FIG. 2 show, the present invention discloses a modular replaceable mobile communication device 1, which is modularized to comprise an electronic device 20 for performing 3G/4G/5G/6G/mobile communication and a frame assembly 10. According to the present invention, the frame assembly 10 comprises a circuit board 15 having an electrical connection interface 12 and a frame 14 disposed on the circuit board 15, wherein the frame 14 has a receiving recess 141, and a first electrical connector 142 is disposed on a side wall 14S of the receiving recess 141 so as to electrically connect to the circuit board 15.

Figure 3:
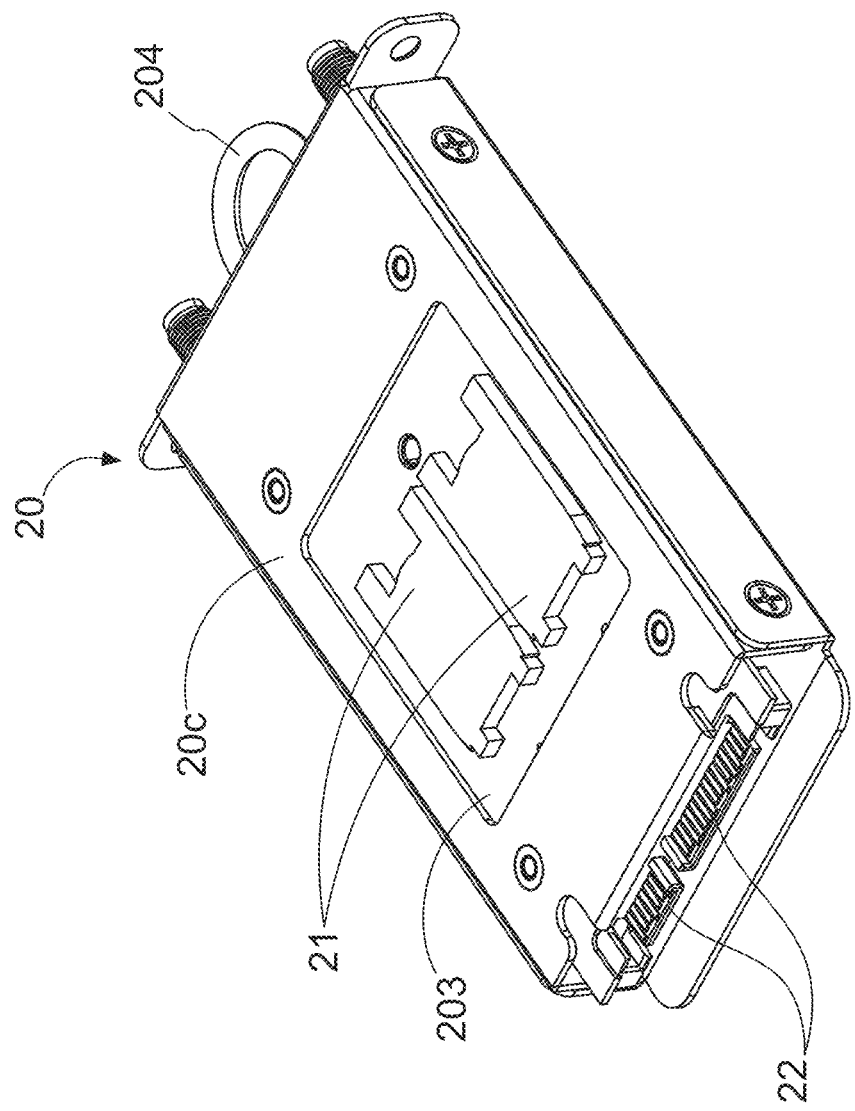
FIG. 3 shows a stereo diagram of an electronic device of the modular replaceable mobile communication device.

FIG. 3 shows a stereo diagram of an electronic device of the modular replaceable mobile communication device. As FIG. 2 and FIG. 3 show, the electronic device 20 is disposed in the receiving recess 141, and comprises a second casing 20c, a mobile communication circuit 20M disposed in the second casing 20c, at least one SIM card electrically connected to the mobile communication circuit 20M, at least one antenna 23 connected to the second casing 20c and electrically connected to the mobile communication circuit 20M, and a second electrical connector 22 electrically connected between the mobile communication circuit 20M and the first electrical connector 142.

As described in more detail below, a bottom side of the second casing 20c is provided with a third opening 203 thereon, such that at least one socket 21 electrically connected to the mobile communication circuit 20M is exposed out of the second casing 20c through the third opening 203, and the SIM card is disposed in the socket 21. The SIM card can be a 3G SIM card, a 4G SIM card, a 5G SIM card, or a 6G SIM card. Therefore, by inserting the modular replaceable mobile communication device 1 into the accommodation space 20S in the first casing of the host electronic device 2, the electrical connection interface 12 of the circuit board 15 is inserted into an electrical slot that is arranged in a printed circuit board 202 in the first casing of the host electronic device 2 (shown in FIG. 5), such that a function expansion of mobile communication for the host electronic device 2 is therefore achieve.

As FIG. 2 and FIG. 3 show, the modular replaceable mobile communication device 1 is inserted into the first casing through a first opening 201 of the first casing, and the frame assembly 10 further comprising a front panel 16 that is connected to the frame 14 and covers the first opening 201. Moreover, the front panel 16 is provided with a second opening 161 thereon, and a rear-end side of the second casing 20c being exposed out of the front panel through the second opening 161. Furthermore, the antenna 23 is connected to the rear-end side of the second casing 20c so as to electrically connected to the mobile communication circuit 20M that is disposed in the second casing 20c, and the rear-end side being provided with a U-shaped 204 rod thereon.

Second Embodiment

Figure 4:
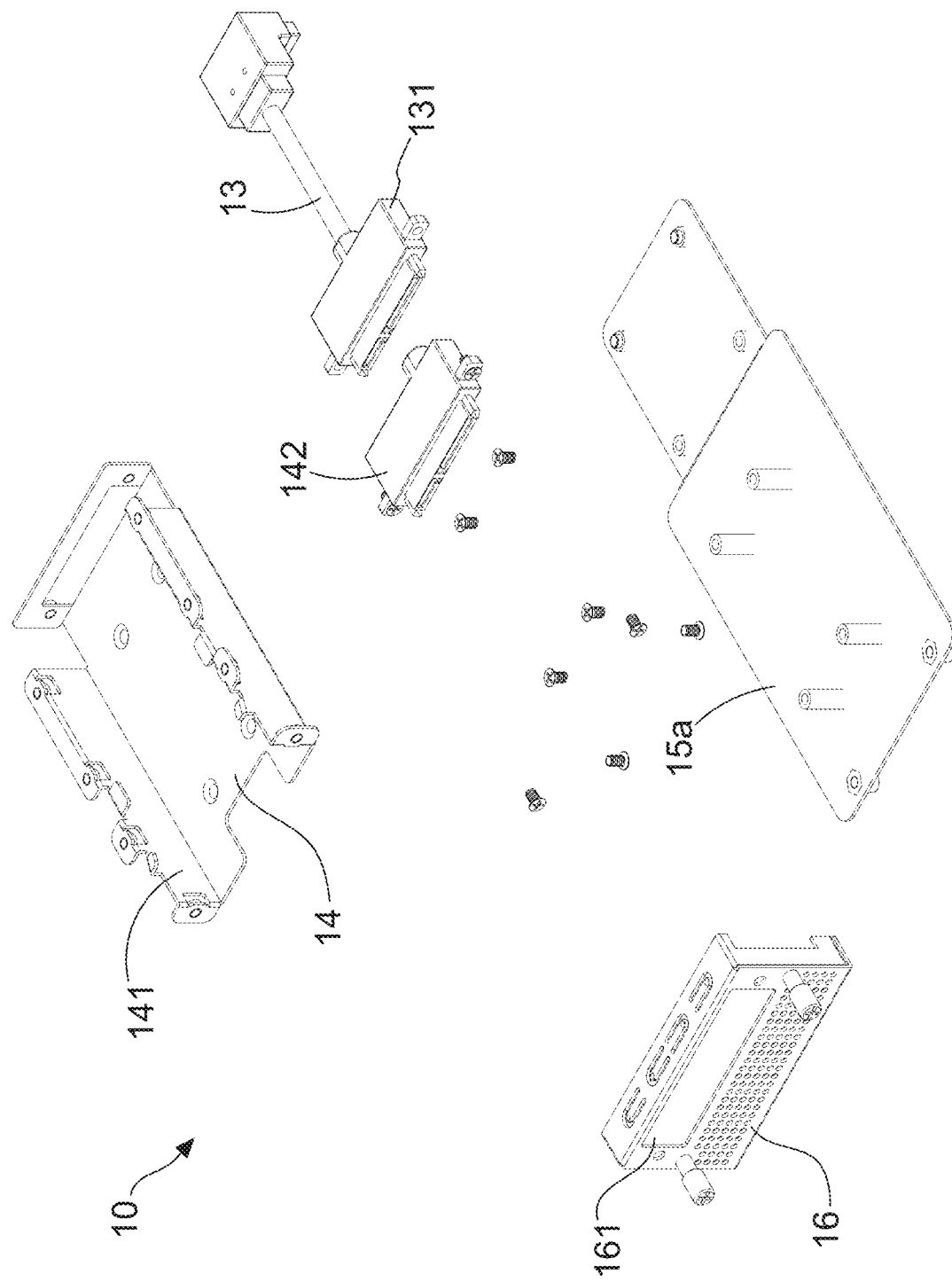
FIG. 4 shows an exploded view of a frame assembly of the modular replaceable mobile communication device.
Figure 5:
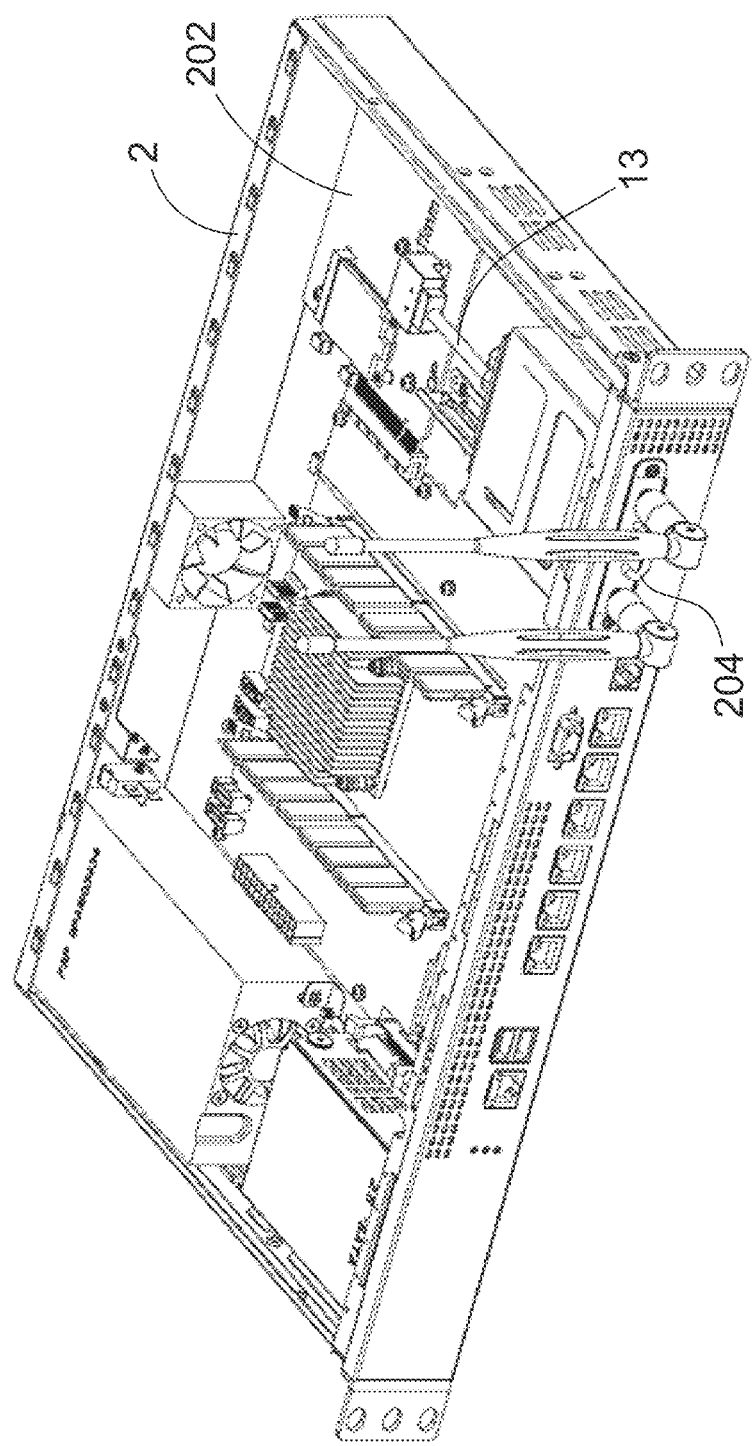
FIG. 5 shows a stereo diagram of the modular replaceable mobile communication device and a host electronic device.

With reference to FIG. 5, there is shown a stereo diagram of the modular replaceable mobile communication device and the host electronic device. Moreover, FIG. 4 shows an exploded view of a frame assembly of the modular replaceable mobile communication device. In second embodiment, the frame assembly 10 is modularized to comprises a supporting board 15a and a frame 14 disposed on the supporting board 15a, wherein the frame 14 has a receiving recess 141, and a first electrical connector 142 is disposed on a side wall 14S of the receiving recess 141. In second embodiment, the electronic device 20 is disposed in the receiving recess 141, and also comprises: a second casing 20c, a mobile communication circuit 20M, at least one socket 21, at least one SIM card, at least one antenna 23, and a second electrical connector 22 electrically connected between the mobile communication circuit 20M and the first electrical connector 142.

In second embodiment, the modular replaceable mobile communication device 1 further comprises an electrical cable 13, wherein two ends of the electrical cable 13 are connected with said first electrical connector 142 and a third electrical connector 131, respectively. Therefore, by inserting the modular replaceable mobile communication device 1 into the accommodation space 20S through the first casing 201 of the host electronic device 2, the third electrical connector 131 of the electrical cable 13 is electrically connected to an electrical connection interface that is arranged in a printed circuit board 202 in the first casing, such that a function expansion of mobile communication for the host electronic device is therefore achieve. For example, said electrical cable 13 can be a flexible flat cable used for electrically connected between the modular replaceable mobile communication device 1 and the printed circuit board 202 of the host electronic device 2.

Third Embodiment

Figure 6:
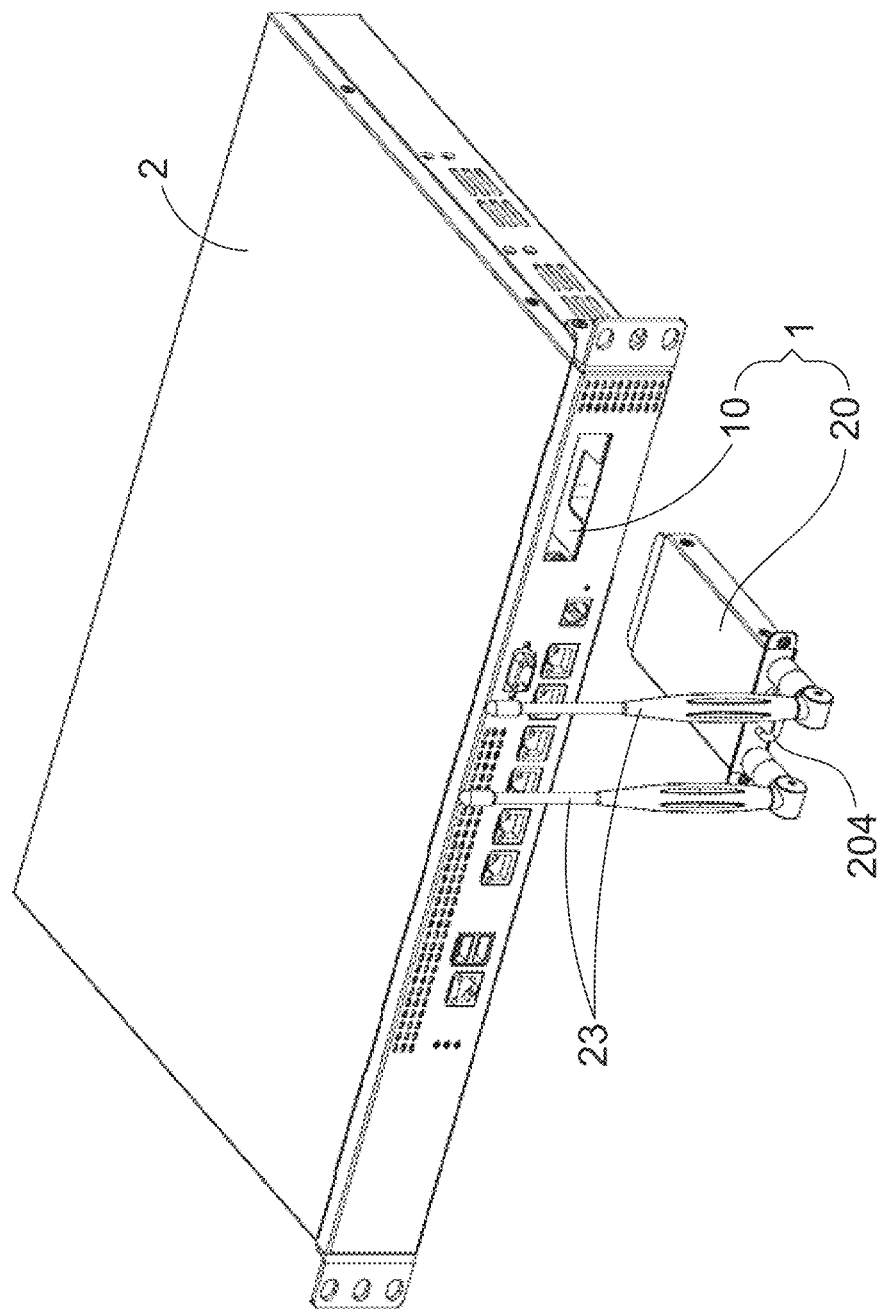
FIG. 6 shows a stereo diagram of the electronic device and the frame assembly of the modular replaceable mobile communication device and the host electronic device.

With reference to FIG. 6, there is shown a stereo diagram of the electronic device and the frame assembly of the modular replaceable mobile communication device and the host electronic device. In third embodiment, the frame assembly 10 of the modular replaceable mobile communication device 1 is disposed in an accommodation space 20S in the first casing of the host electronic device 2. Furthermore, the electronic device 20 is inserted into the receiving recess 141 of the frame 14 of the frame assembly 10 through the first opening 201. Briefly speaking, in case of wanting to replace the electronic device 20 by another one, it just need to remove a first electronic device (i.e., the old electronic device 20) from the frame 14 of the frame assembly 10, and then putting a second electronic device (i.e., a new electronic device 20) into the receiving recess 141 of the frame 14 of the frame assembly 10 through the first opening 201. In a practicable embodiment, the first electronic device and the second electronic device may have the same mobile communication module, like 3G/4G/5G/6G module. On another one practicable embodiment, the mobile communication module of the first electronic device may be different from that of the second electronic device.

Therefore, through above descriptions, all embodiments and their constituting elements of the wireless communication device according to the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A modular replaceable mobile communication device, being disposed in an accommodation space in a first casing of a host electronic device, wherein the modular replaceable mobile communication device is moved into the accommodation space by passing through a first opening of the first casing, and comprising:
    a frame assembly, comprising a circuit board having an electrical connection interface, a frame disposed on the circuit board, and a front panel connected to the frame, wherein the frame has a receiving recess, the front panel having a second opening, and a first electrical connector being disposed on a side wall of the receiving recess so as to electrically connect to the circuit board; and
    an electronic device, being disposed in the receiving recess, and comprising a second casing, a mobile communication circuit disposed in the second casing, at least one SIM card electrically connected to the mobile communication circuit, at least one antenna connected to the second casing and electrically connected to the mobile communication circuit, and a second electrical connector electrically connected between the mobile communication circuit and the first electrical connector;
    wherein by inserting the mobile communication device into the accommodation space in the first casing of the host electronic device, the electrical connection interface being inserted into an electrical slot that is arranged in a printed circuit board in the first casing, such that a function expansion of mobile communication for the host electronic device is therefore achieve;
    wherein a rear-end side of the second casing is exposed out of the front panel through the second opening, and a bottom side of the second casing is provided with a third opening thereon, such that at least one socket electrically connected to the mobile communication circuit is exposed out of the second casing through the third opening, and the SIM card being disposed in the socket.

2. The modular replaceable mobile communication device of claim 1, wherein the SIM card is selected from a group consisting of 3G SIM card, 4G SIM card, 5G SIM card, and 6G SIM card.

3. The modular replaceable mobile communication device of claim 1, wherein the antenna is connected to the rear-end side of the second casing so as to electrically connected to the mobile communication circuit that is disposed in the second casing, and the rear-end side being provided with a U-shaped rod thereon.

4. A modular replaceable mobile communication device, being disposed in an accommodation space in a first casing of a host electronic device, wherein the modular replaceable mobile communication device is moved into the accommodation space by passing through a first opening of the first casing, and comprising:
    a frame assembly, comprising a supporting board, a frame disposed on the supporting board, and a front panel connected to the frame, wherein the frame has a receiving recess, the front panel having a second opening, and a first electrical connector being disposed on a side wall of the receiving recess;
    an electronic device, being disposed in the receiving recess, and comprising a second casing, a mobile communication circuit disposed in the second casing, at least one SIM card electrically connected to the mobile communication circuit, at least one antenna connected to the second casing and electrically connected to the mobile communication circuit, and a second electrical connector electrically connected between the mobile communication circuit and the first electrical connector; and
    an electrical cable, wherein two ends of the electrical cable are electrically connected with said first electrical connector and a third electrical connector, respectively;
    wherein by inserting the mobile communication device into the accommodation space in the first casing of the host electronic device, the third electrical connector being electrically connected to an electrical connection interface that is arranged in a printed circuit board in the first casing, such that a function expansion of mobile communication for the host electronic device is therefore achieve;
    wherein a rear-end side of the second casing is exposed out of the front panel through the second opening, and a bottom side of the second casing is provided with a third opening thereon, such that at least one socket electrically connected to the mobile communication circuit is exposed out of the second casing through the third opening, and the SIM card being disposed in the socket.

5. The modular replaceable mobile communication device of claim 4, wherein the SIM card is selected from a group consisting of 3G SIM card, 4G SIM card, 5G SIM card, and 6G SIM card.

6. The modular replaceable mobile communication device of claim 4, wherein the antenna is connected to the rear-end side of the second casing so as to electrically connected to the mobile communication circuit that is disposed in the second casing, and the rear-end side being provided with a U-shaped rod thereon.

* * * * *